(12) United States Patent
Hashimoto et al.

(10) Patent No.: US 10,375,500 B2
(45) Date of Patent: Aug. 6, 2019

(54) PROPAGATION DELAY CORRECTION APPARATUS AND PROPAGATION DELAY CORRECTION METHOD

(71) Applicant: CLARION CO., LTD., Saitama (JP)

(72) Inventors: Takeshi Hashimoto, Motomiya (JP); Tetsuo Watanabe, Hasuda (JP); Yasuhiro Fujita, Kashiwa (JP); Kazutomo Fukue, Saitama (JP)

(73) Assignee: CLARION CO., LTD., Saitama (JP)

( * ) Notice: Subject to any disclaimer, the term of this patent is extended or adjusted under 35 U.S.C. 154(b) by 0 days.

(21) Appl. No.: 14/901,165

(22) PCT Filed: Jun. 19, 2014

(86) PCT No.: PCT/JP2014/066222
§ 371 (c)(1),
(2) Date: Dec. 28, 2015

(87) PCT Pub. No.: WO2014/208431
PCT Pub. Date: Dec. 31, 2014

(65) Prior Publication Data
US 2016/0134985 A1 May 12, 2016

(30) Foreign Application Priority Data
Jun. 27, 2013 (JP) ................. 2013-134808

(51) Int. Cl.
*H04S 7/00* (2006.01)
*H04R 5/00* (2006.01)
(Continued)

(52) U.S. Cl.
CPC ......... *H04S 7/302* (2013.01); *H03H 17/0009* (2013.01); *H03H 17/0213* (2013.01);
(Continued)

(58) Field of Classification Search
CPC ............... H03G 5/00; H04B 3/20; H04R 5/00
See application file for complete search history.

(56) References Cited

U.S. PATENT DOCUMENTS

| 5,305,386 A | * | 4/1994 | Yamato | H04S 7/302 |
|---|---|---|---|---|
| | | | | 381/1 |
| 5,386,473 A | * | 1/1995 | Harrison | H04R 5/04 |
| | | | | 381/1 |

(Continued)

FOREIGN PATENT DOCUMENTS

| CN | 1714601 | 12/2005 |
|---|---|---|
| CN | 102055325 | 5/2011 |

(Continued)

OTHER PUBLICATIONS

"Creating depth: The Haas effect" by Luis Diaz. Sep. 14, 2011. (Year: 2011).*

(Continued)

*Primary Examiner* — Jialong He
(74) *Attorney, Agent, or Firm* — McCarter & English, LLP (57) ABSTRACT

A propagation delay tune correction apparatus comprising a means for generating a frequency spectrum signal by performing short-term Fourier transform on an audio signal; a means for setting a propagation delay time for each of a plurality of predetermined frequency bands; a means for calculating a phase control amount for each of the plurality of predetermined frequency bands on a basis of the propagation delay time set for each of the plurality of predetermined frequency bands; a means for generating a phase control signal by smoothing the calculated phase control amount for each of the plurality of predetermined frequency bands; a means for controlling a phase of the frequency spectrum signal for each of the plurality of predetermined frequency bands on a basis of the generated phase control (Continued)

signal; and a means for generating an audio signal on which a propagation delay correction is performed by performing inverse short-term Fourier transform on the frequency spectrum signal of which the phase is controlled for each of the plurality of predetermined frequency bands.

6 Claims, 10 Drawing Sheets

(51) Int. Cl.
    *H04S 1/00*     (2006.01)
    *H03H 17/00*     (2006.01)
    *H03H 17/02*     (2006.01)
    *H03H 17/08*     (2006.01)
    *H04R 3/04*     (2006.01)

(52) U.S. Cl.
    CPC .............. *H03H 17/08* (2013.01); *H04R 3/04* (2013.01); *H04S 1/00* (2013.01); *H04R 2499/13* (2013.01); *H04S 2420/07* (2013.01)

(56) References Cited

U.S. PATENT DOCUMENTS

| | | | | |
|---|---|---|---|---|
| 5,988,314 | A * | 11/1999 | Negishi | H04R 1/345 181/144 |
| 6,498,856 | B1 * | 12/2002 | Itabashi | H04R 5/02 381/1 |
| 6,928,172 | B2 | 8/2005 | Ohta | |
| 8,233,629 | B2 | 7/2012 | Johnston | |
| 8,358,790 | B2 | 1/2013 | Teramoto et al. | |
| 8,385,556 | B1 * | 2/2013 | Warner | G10L 19/008 381/106 |
| 8,532,802 | B1 * | 9/2013 | Johnston | G11B 27/034 381/17 |
| 8,750,529 | B2 | 6/2014 | Shidoji et al. | |
| 8,983,834 | B2 | 3/2015 | David | |
| 9,659,555 | B1 * | 5/2017 | Hilmes | G10K 11/002 |
| 2001/0016047 | A1 * | 8/2001 | Ohta | H04S 7/301 381/98 |
| 2001/0021257 | A1 * | 9/2001 | Ishii | H04R 5/033 381/17 |
| 2002/0034308 | A1 * | 3/2002 | Usui | H04R 5/02 381/17 |
| 2002/0054685 | A1 * | 5/2002 | Avendano | H04M 9/082 381/66 |
| 2002/0154783 | A1 * | 10/2002 | Fincham | H04S 1/002 381/17 |
| 2004/0258247 | A1 * | 12/2004 | Shigaki | G11B 20/00007 381/17 |
| 2005/0169488 | A1 * | 8/2005 | Kato | H04S 7/302 381/98 |
| 2005/0271223 | A1 * | 12/2005 | Itabashi | H04R 1/403 381/98 |
| 2006/0106620 | A1 * | 5/2006 | Thompson | G10L 19/008 704/500 |
| 2006/0143000 | A1 * | 6/2006 | Setoguchi | G10L 21/04 704/205 |
| 2007/0140499 | A1 * | 6/2007 | Davis | G10L 19/008 381/23 |
| 2007/0223740 | A1 * | 9/2007 | Reams | G10L 19/008 381/119 |
| 2007/0238415 | A1 * | 10/2007 | Sinha | G10L 19/0208 455/66.1 |
| 2007/0291959 | A1 * | 12/2007 | Seefeldt | H03G 3/32 381/104 |
| 2007/0297519 | A1 * | 12/2007 | Thompson | G10L 19/008 375/241 |
| 2008/0025518 | A1 * | 1/2008 | Mizuno | H04S 3/002 381/17 |
| 2008/0187156 | A1 * | 8/2008 | Yokota | H04R 1/025 381/307 |
| 2008/0306745 | A1 * | 12/2008 | Roy | G10L 19/008 704/500 |
| 2009/0003634 | A1 | 1/2009 | Kushida | |
| 2009/0018680 | A1 * | 1/2009 | Matsuoka | G10L 19/018 700/94 |
| 2009/0220109 | A1 * | 9/2009 | Crockett | H03G 3/3089 381/107 |
| 2010/0054482 | A1 * | 3/2010 | Johnston | H04S 1/002 381/17 |
| 2010/0208905 | A1 * | 8/2010 | Franck | H04S 3/008 381/59 |
| 2010/0260356 | A1 * | 10/2010 | Teramoto | H04S 3/002 381/120 |
| 2010/0290628 | A1 * | 11/2010 | Shidoji | H04S 7/30 381/1 |
| 2011/0035215 | A1 * | 2/2011 | Sompolinsky | G10L 15/02 704/231 |
| 2011/0103590 | A1 | 5/2011 | Christoph et al. | |
| 2011/0145003 | A1 * | 6/2011 | Bessette | G10L 19/0212 704/500 |
| 2011/0164855 | A1 * | 7/2011 | Crockett | G10L 21/02 386/230 |
| 2011/0169721 | A1 * | 7/2011 | Bauer | G10L 21/0208 345/84 |
| 2011/0176688 | A1 * | 7/2011 | Sugiyama | H04M 9/082 381/66 |
| 2011/0206223 | A1 * | 8/2011 | Ojala | G10L 19/008 381/300 |
| 2012/0063614 | A1 * | 3/2012 | Crockett | G11B 20/10527 381/98 |
| 2012/0063615 | A1 * | 3/2012 | Crockett | G10L 21/0205 381/98 |
| 2012/0113224 | A1 * | 5/2012 | Nguyen | G06K 9/0057 348/46 |
| 2012/0155651 | A1 | 6/2012 | Obata et al. | |
| 2012/0204705 | A1 * | 8/2012 | Nakayama | G10H 1/32 84/744 |
| 2012/0245927 | A1 * | 9/2012 | Bondy | G10L 21/0232 704/203 |
| 2012/0288121 | A1 * | 11/2012 | Matsui | H03G 3/3005 381/107 |
| 2013/0024190 | A1 * | 1/2013 | Fairey | G10L 21/0364 704/205 |
| 2013/0077792 | A1 * | 3/2013 | Bruney | H04R 5/00 381/17 |
| 2013/0091167 | A1 * | 4/2013 | Bertin-Mahieux | G06F 17/30743 707/769 |
| 2013/0170647 | A1 * | 7/2013 | Reilly | H04R 27/00 381/17 |
| 2013/0294605 | A1 * | 11/2013 | Hagioka | H04R 5/00 381/17 |
| 2014/0142957 | A1 * | 5/2014 | Sung | G10L 19/005 704/500 |
| 2014/0180673 | A1 * | 6/2014 | Neuhauser | G10L 19/018 704/9 |
| 2014/0241549 | A1 * | 8/2014 | Stachurski | H04M 3/568 381/92 |
| 2014/0376744 | A1 * | 12/2014 | Hetherington | H03G 3/20 381/94.2 |
| 2015/0010155 | A1 * | 1/2015 | Virette | G10L 19/008 381/23 |
| 2015/0049872 | A1 * | 2/2015 | Virette | G10L 19/008 381/23 |
| 2015/0205569 | A1 * | 7/2015 | Sanders | G06F 3/165 381/71.14 |
| 2015/0302845 | A1 * | 10/2015 | Nakano | G10L 13/02 704/267 |
| 2015/0325232 | A1 * | 11/2015 | Tachibana | G10L 13/02 704/268 |
| 2015/0373476 | A1 * | 12/2015 | Christoph | H04S 7/302 381/303 |
| 2016/0005420 | A1 * | 1/2016 | Furuta | G10L 21/0364 704/205 |
| 2016/0260429 | A1 * | 9/2016 | Jin | G10L 15/08 |

(56) References Cited

U.S. PATENT DOCUMENTS

| | | | |
|---|---|---|---|
| 2017/0105070 A1* | 4/2017 | O'Polka | H04R 5/02 |
| 2017/0131968 A1* | 5/2017 | Strub | G06F 3/165 |
| 2017/0347331 A1* | 11/2017 | Daley | H04W 56/0065 |

FOREIGN PATENT DOCUMENTS

| | | | |
|---|---|---|---|
| CN | 102055425 A | | 5/2011 |
| CN | 102144405 | | 8/2011 |
| EP | 2252083 | | 11/2010 |
| EP | 2 326 108 | | 5/2011 |
| JP | 7-162985 | | 6/1995 |
| JP | 2001-224092 | | 8/2001 |
| JP | 2005-223887 | | 8/2005 |
| JP | 2007-526522 | | 9/2007 |
| JP | 2008-283600 | | 11/2008 |
| JP | 2008283600 A | * | 11/2008 |
| JP | 2009-010491 A | | 1/2009 |
| JP | 2009-038470 A | | 2/2009 |
| JP | 2010-288262 | | 12/2010 |
| WO | 2009/095965 | | 8/2009 |
| WO | 2010/150705 A1 | | 12/2010 |

OTHER PUBLICATIONS

Smith, "Phase Unwrapping", a book chapter from "Introduction to Digital Filters with Audio Applications", by Julius O. Smith III, (Sep. 2007 Edition). Retrieved from "www.archive.org", archiving date: Nov. 4, 2012 (Year: 2012).*
International Search Report of PCT/JP2014/066222.
International Preliminary Report on Patentability issued in PCT Application No. PCT/JP2014/066222 dated Jan. 7, 2016.
Office Action issued in Chinese Application No. 201480036038.2 dated Sep. 29, 2016.
Extended European Search Report issued in Application No. 14818103.5 dated Jan. 26, 2017.
Japanese Office Action issued in Application No. 2013-134808 dated Feb. 28, 2017.
Chinese Office Action, along with its English translation issued in Application No. 201480036038.2 dated May 11, 2017.
Chinese Office Action Issued in Application No. CN201480036038.2 dated Nov. 7, 2017.
Summons to attend oral proceedings pursuant to Rule 115(1) EPC issued in EP Application No. 14818103.5 dated Mar. 5, 2018.
Fourth Office Action issued in Chinese Application No. 2018041901702800 dated Apr. 24, 2018 along with English translation.
Luis Diaz; "Creating Depth: The Haas Effect"; https://mixcoach.com/creating-depth-the-haas-effect-2/; Sep. 14, 2011.
Office Action dated Apr. 24, 2018, in Chinese Application No. 201480036038.2, along with English translation thereof (14 pages).
Communication from the Examining Division, dated Oct. 16, 2017, in European Application No. 14818103.5 (4 pages).
Intention to Grant, communication dated Sep. 11, 2018, in European Application No. 14818103.5 (5 pages).
Decision to Grant a Patent, dated Sep. 6, 2017, in Japanese Application No. 2013-134808, along with English translation (6 pages).
Office Action dated Oct. 22, 2018, in Chinese Application No. 201480036038.2, along with English ranslation thereof (12 pages).
European Communication for Application No. EP14818103 dated Oct. 16, 2017.

* cited by examiner

PROPAGATION DELAY CORRECTION APPARATUS AND PROPAGATION DELAY CORRECTION METHOD

This application is a National Phase Application of PCT International Application No.: PCT/JP2014/066222, filed on Jun. 19, 2014.

TECHNICAL FIELD

The present invention relates to a propagation delay correction apparatus and a propagation delay correction method for correcting propagation delay of an audio signal.

BACKGROUND ART

Generally, in vehicles such as passenger vehicles, speakers are provided at a plurality of positions. For example, a left front speaker and a right front speaker are provided at positions symmetrical to each other with respect to a central line of an in-vehicle space. However, if a listening position of a listener (a driver seat, a front passenger seat, a rear seat or the like) is considered as a reference position, these speakers are not positioned symmetrically. Therefore, due to differences in distances between the listening position of the listener and each of a plurality of speakers, sound image localization bias by Haas effect occurs.

For example, Japanese Patent Provisional Publication No. H7-162985A (hereinafter, "Patent Document 1") discloses an apparatus that is capable of remedying the sound image localization bias. The apparatus disclosed in Patent Document 1 suppresses the sound image localization bias by adjusting time such that playback sounds emitted from all of the speakers reach the listener at the same time (i.e., a time alignment process). More specifically, the apparatus disclosed in Patent Document 1 corrects, over the entire range, the sound image localization bias and frequency characteristic disorders due to phase interferences by dividing an audio signal into a high range and a low range using a band dividing circuit and then adjusting time of each of playback sounds to be emitted from each of low band speakers and high band speakers.

However, the apparatus disclosed in Patent Document 1 has a problem that linearity of transmission characteristic at the listening position of the listener degrades due to loss of signals and double additions that occur in the band dividing circuit. Furthermore, the apparatus disclosed in Patent Document 1 also has a problem that peaks and/or dips occur in frequency characteristic around a crossover frequency when mixing the signals divided by the band dividing circuit.

In view of above, a brochure of International Patent Publication No. WO2009/095965A1 (hereinafter, "Patent Document 2") proposes an apparatus for performing a time alignment process that is capable of improving linearity of transmission characteristic at the listening position of the listener and suppressing occurrence of peaks and/or dips in frequency characteristic when mixing.

SUMMARY OF THE INVENTION

The apparatus disclosed in Patent Document 2 uses a digital filter to improve linearity of transmission characteristic at the listening position of the listener. More specifically, the apparatus disclosed in Patent Document 2 uses an FIR (Finite Impulse Response) filter. The FIR filter disclosed in Patent Document 2 is a high order filter having a steep cutoff frequency to suppress the occurrence of peaks and/or dips, and is constituted of a plurality of delay circuits and multipliers. Therefore, there is a problem that processing load is large. Also, with the configuration disclosed in Patent Document 2, numbers of required delay circuits and multipliers increase as the number of divided frequency bands increases. Therefore, there is a problem that the processing load increases.

The present invention is made in view of the above circumstances, and the object of the present invention is to provide a propagation delay correction apparatus and a propagation delay correction method that improve the linearity of transmission characteristic at the listening position of the listener and suppress the occurrence of the peaks and/or dips between frequency bands while suppressing the increase in the processing load.

A propagation delay correction apparatus according to an embodiment of the present invention comprises a frequency spectrum signal generating means configured to generate a frequency spectrum signal by performing short-term Fourier transform on an audio signal; a propagation delay time setting means configured to set a propagation delay time for each of a plurality of predetermined frequency bands; a phase control amount calculation means configured to calculate a phase control amount for each of the plurality of predetermined frequency bands on a basis of the propagation delay time set for each of the plurality of predetermined frequency bands; a phase control signal generating means configured to generate a phase control signal by smoothing the calculated phase control amount for each of the plurality of predetermined frequency bands; a phase control means configured to control a phase of the frequency spectrum signal for each of the plurality of predetermined frequency bands on a basis of the generated phase control signal; and an audio signal generating means configured to generate an audio signal on which a propagation delay correction is performed by performing inverse short-term Fourier transform on the frequency spectrum signal of which the phase is controlled for each of the plurality of predetermined frequency bands.

As described above, with the present embodiment, the propagation delay times between a plurality of frequency bands are adjusted (corrected) without using a large number of FIR filters by performing the phase control for each frequency band. Therefore, the linearity of transmission characteristic at the listening position of the listener is improved while suppressing the increase in the processing load. Also, the frequency characteristic disorders due to phase interferences between frequency bands (the occurrence of the peaks and/or dips) are suppressed by smoothing phase changes between frequency bands of which the propagation delay times differ from each other through the smoothing process.

The phase control means may be configured to rotate and offset the phase of the frequency spectrum signal for each of the plurality of predetermined frequency bands on the basis of the phase control signal.

The propagation delay correction apparatus may be configured to comprise a frequency band specifying means capable of specifying at least one of a number and a width of frequency bands to which the propagation delay time is to be set by the propagation delay time setting means.

A propagation delay time correction method according to embodiment of the present invention includes a frequency spectrum signal generating step of generating a frequency spectrum signal by performing short-term Fourier transform on an audio signal; a propagation delay time setting step of setting a propagation delay time for each of a plurality of predetermined frequency bands; a phase control amount calculation step of calculating a phase control amount for each of the plurality of predetermined frequency bands on a basis of the propagation delay time set for each of the plurality of predetermined frequency bands; a phase control signal generating step of generating a phase control signal by smoothing the calculated phase control amount for each of the plurality of predetermined frequency bands; a phase control step of controlling a phase of the frequency spectrum signal for each of the plurality of predetermined frequency bands on a basis of the generated phase control signal; and an audio signal generating step of generating audio signal on which a propagation delay correction is performed by performing inverse short-term Fourier transform on the frequency spectrum signal of which the phase is controlled for each of the plurality of predetermined frequency bands.

According to the propagation delay time correction method of the above embodiment, the propagation delay times between a plurality of frequency bands are adjusted (corrected) without using a large number of FIR filters by performing the phase control for each frequency band. Therefore, the linearity of transmission characteristic at the listening position of the listener is improved while suppressing the increase in the processing load. Also, the frequency characteristic disorders due to phase interferences between frequency bands (the occurrence of the peaks and/or dips) are suppressed by smoothing phase changes between frequency bands of which the propagation delay times differ from each other through the smoothing process.

EMBODIMENTS FOR CARRYING OUT THE INVENTION

Hereinafter, embodiments of the present invention will be described with reference to the accompanying drawings. It is noted that, in the following, a sound processing device is given as an example of the embodiments of the present invention and explained.

[Configuration of Sound Processing Device 1 and Time Alignment Process Flow]

Figure 1:
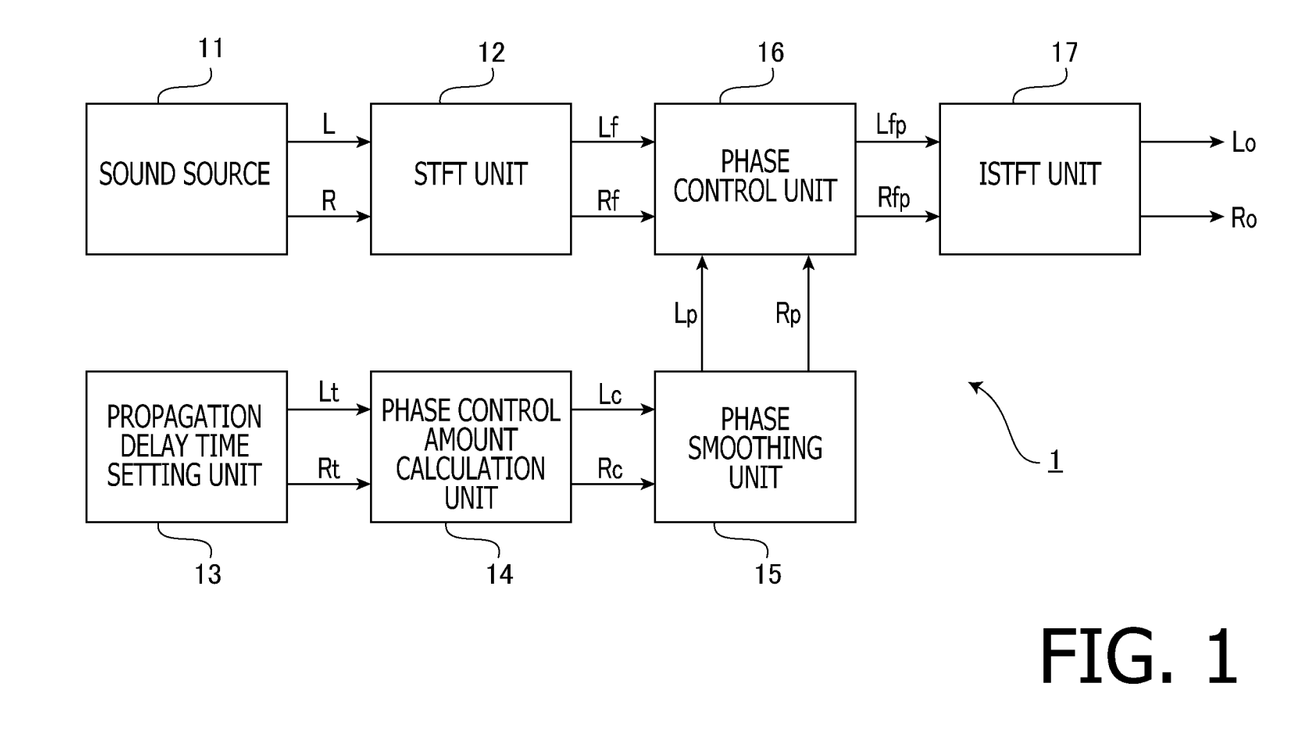
FIG. 1 is a block diagram showing a configuration of a sound processing device according to an embodiment of the present invention.
Figure 2:
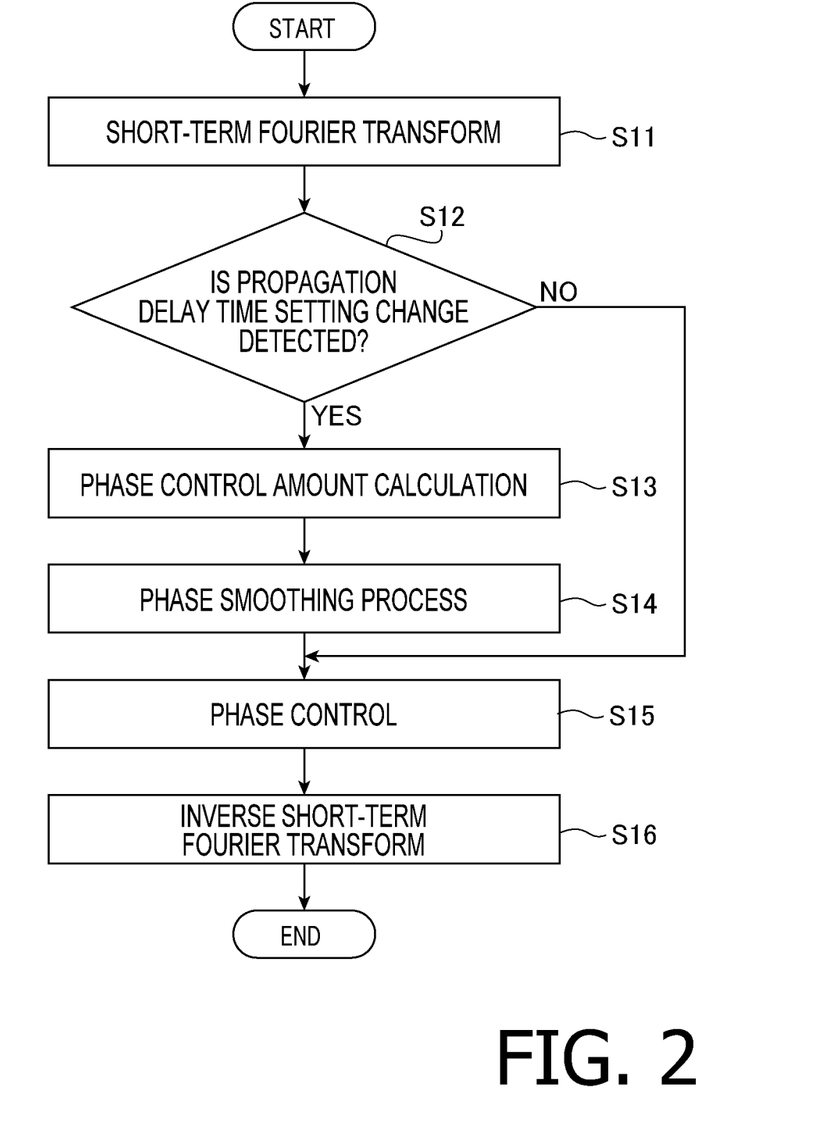
FIG. 2 is a diagram showing a flow chart of a time alignment process to be executed by the sound processing device according to the embodiment of the present invention.

FIG. 1 is a block diagram showing a configuration of a sound processing device 1 of the present embodiment. As shown in FIG. 1, the sound processing device 1 of the present embodiment comprises a sound source 11, a short-term Fourier transform (SIFT: Short-Term Fourier Transform) unit 12, a propagation delay time setting unit 13, a phase control amount calculation unit 14, a phase smoothing unit 15, a phase control unit 16, and an inverse short-term Fourier transform (ISTFT: Inverse Short-Term Fourier Transform) unit 17. The sound processing device 1 adjusts a propagation delay time of an L channel and an R channel of a stereo audio signal (i.e., the sound processing device 1 performs time alignment process) to suppress the sound image localization bias by Haas effect. By outputting the audio signal of which the propagation delay time is adjusted (corrected) through speakers via a power amplifier not shown, a user can listen to music or the like in an environment in which the sound image localization bias is suppressed. FIG. 2 shows a flow chart of a time alignment process to be executed by the sound processing device 1. It is noted that a time alignment process in a case where there are two channels is explained in the present embodiment for convenience but a time alignment process in a case where there are three channels or more is also within the scope of the present invention.

[S11 in FIG. 2 (Short-Term Fourier Transform)]

To the STFT unit 12, stereo audio signals L and R obtained by decoding the encoded signals in a reversible or nonreversible compressing format are inputted from the sound source 11. The STFT unit 12 performs overlapping processes and weightings by the use of a window function on each of the inputted audio signals L and R, converts the weighted signals from the time domain to the frequency domain using STFT, and outputs real part and imaginary part frequency spectra Lf and Rf.

[S12 in FIG. 2 (Detection of Change in Propagation Delay Time Setting)]

The propagation delay time setting unit 13 is an interface that receives propagation delay time setting operations from the user. The user can set a propagation delay time for each predetermined frequency band of each of L channel and R channel (e.g., each of a plurality of frequency bands into which the audible range is divided) by operating the propagation delay time setting unit 13. Number and width of the frequency bands to which the propagation delay time is to be set can be specified through the operations of the propagation delay time setting unit 13. The propagation delay time setting unit 13 outputs propagation delay time signals Lt and Rt according the setting operation. In the present flow chart, when a change in a propagation delay time setting is detected from the signals Lt and Rt outputted from the propagation delay time setting unit 13 (S12 in FIG. 2: YES), the process proceeds to process step S13 in FIG. 2 (phase control amount calculation). When a change in the propagation delay time setting is not detected from the signals Lt and Rt outputted from the propagation delay time setting unit 13 (S12 in FIG. 2; NO), the process proceeds to process step S15 in FIG. 2 (phase control).

It is noted that the change in the propagation delay time setting is not limited to manual operations. As another variation of the present embodiment, for example, a microphone is set at a listening position of a listener (a driver seat, a front passenger seat, a rear seat or the like). In the variation, acoustic characteristic of an in-vehicle space is measured using the microphone set at the listening position of the listener, and the propagation delay time for each frequency band of each channel is automatically set on the basis of the measurement result.

[S13 in FIG. 2 (Phase Control Amount Calculation)]

The phase control amount calculation unit 14 calculates the phase control amount for each frequency band on the basis of the propagation delay time signals Lt and Rt for each frequency band inputted from the propagation delay time setting unit 13, and outputs calculated phase control amount signals Lc and Rc to the phase smoothing unit 15. The phase control mentioned above is to control the phase rotation amount of frequency spectrum signals Lf and Rf. Controlling the phase rotation amount is equivalent to controlling the propagation delay time in the time domain. It is noted that, since only the propagation delay time is controlled while maintaining phase within a frequency band, an inverse number of a sampling frequency is a resolution of the propagation delay time. Also, a phase offset according to frequency is given to the phase rotation of each frequency band.

[S14 in FIG. 2 (Phase Smoothing)]

The phase smoothing unit 15 generates phase control signals Lp and Rp for each frequency band by smoothing the phase control amount signals Lc and Rc for each frequency band inputted from the phase control amount calculation unit 14 using an integration process. The phase smoothing unit 15 outputs the generated phase control signals Lp and Rp for each frequency band to the phase control unit 16.

[S15 in FIG. 2 (Phase Control)]

The phase control unit 16 controls phases (performs phase rotations and phase offsets) of the frequency spectrum signals Lf and Rf inputted from the STFT unit 12 for each frequency band on the basis of the phase control signals Lp and Rp for each frequency band inputted from the phase smoothing unit 15. The phase control unit 16 outputs frequency spectrum signals Lfp and Rfp of which phases are controlled for each frequency band to the ISTFT unit 17.

[S16 in FIG. 2 (Inverse Short-Terry Fourier Transform)]

The ISTFT unit 17 converts the frequency spectrum signals Lfp and Rfp inputted from the phase control unit 16 from the frequency domain signals to the time domain signals by ISTFT, and performs weightings, by the use of a window function, and overlap additions on the converted signals. Audio signals Lo and Ro obtained after the overlap additions are signals on which propagation delay corrections are performed in accordance with the setting by the propagation delay time setting unit 13, and are outputted from the ISTFT unit 17 to a later stage circuit (such as a power amplifier or a speaker).

As described above, with the sound processing device 1 according to the present invention, the propagation delay times between a plurality of frequency bands are adjusted (corrected) without using a large number of FIR filters by performing the phase control (phase rotations and phase offsets) for each frequency band. Therefore, linearity of transmission characteristic at the listening position of the listener is improved while suppressing the increase in the processing load. Also, the frequency characteristic disorders due to phase interferences between frequency bands (the occurrence of peaks and/or dips) is suppressed by smoothing phase changes between frequency bands of which the propagation delay times differ from each other through the smoothing process.

[Exemplary Specific Values for Time Alignment Process]

Next, exemplary specific values for the time alignment process performed by the sound processing device 1 will be described. The followings are parameters and values thereof of the exemplary specific values.

Audio Signal Sampling Frequency: 44.1 kHz
Fourier Transform Length: 16,384 samples
Overlap Length: 12,288 samples
Window Function: Hanning
Frequency Band Division Number: 20
(In this example, the audible range is divided into 20 frequency bands.)

Figure 3A:
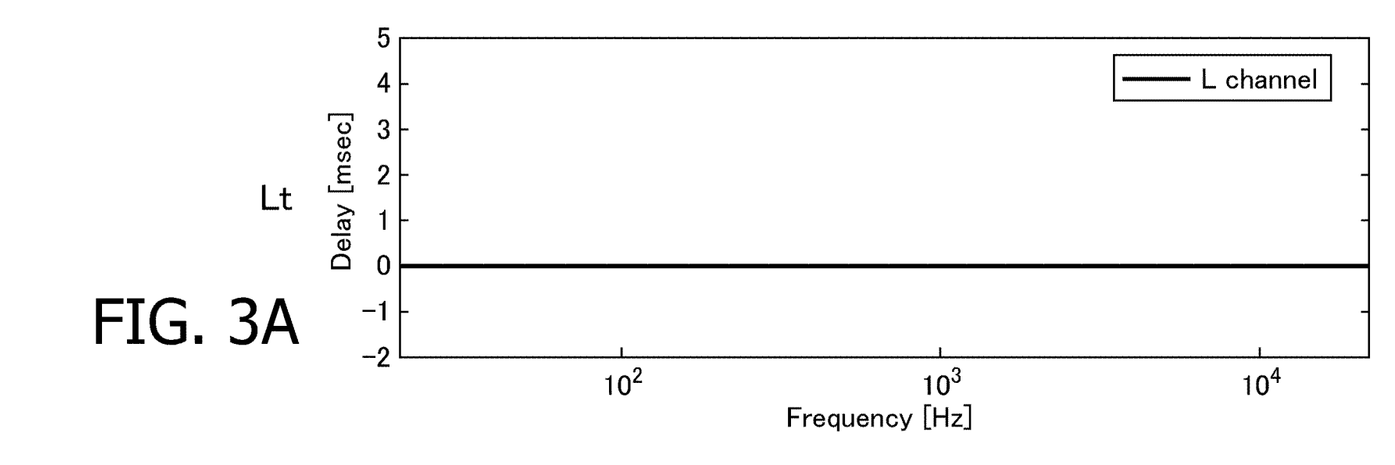
FIG. 3 is a diagram showing an example of propagation delay time signals for each frequency band to be outputted from a propagation delay time setting unit provided to the sound processing device according to the embodiment of the present invention.
Figure 3B:
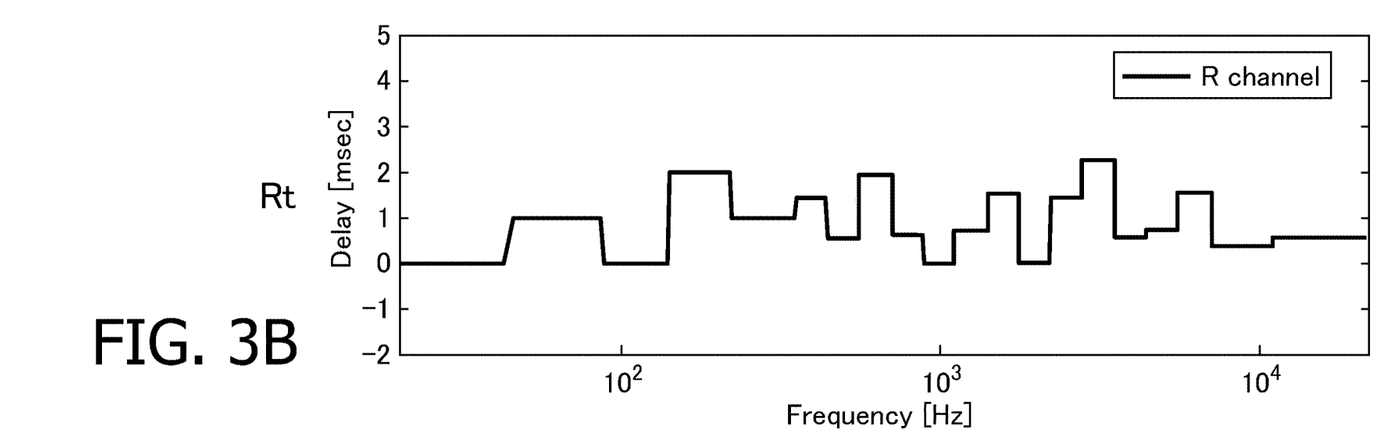

Examples of the propagation delay time signals Lt and Rt for each frequency band outputted from the propagation delay time setting unit 13 are shown in FIG. 3A and FIG. 3B, respectively. In each of FIG. 3A and FIG. 3B, the vertical axis is the delay time (unit: msec) and the lateral axis is the frequency (unit: Hz). As shown in FIG. 3, the propagation delay time for the L channel side signal Lt is 0 msec for all the frequency bands (see FIG. 3A), and the propagation delay time for the R channel side signal Rt is set for each of 20 frequency bands independently in the range of 0 msec-2.2 msec (see FIG. 3B).

Figure 4A:
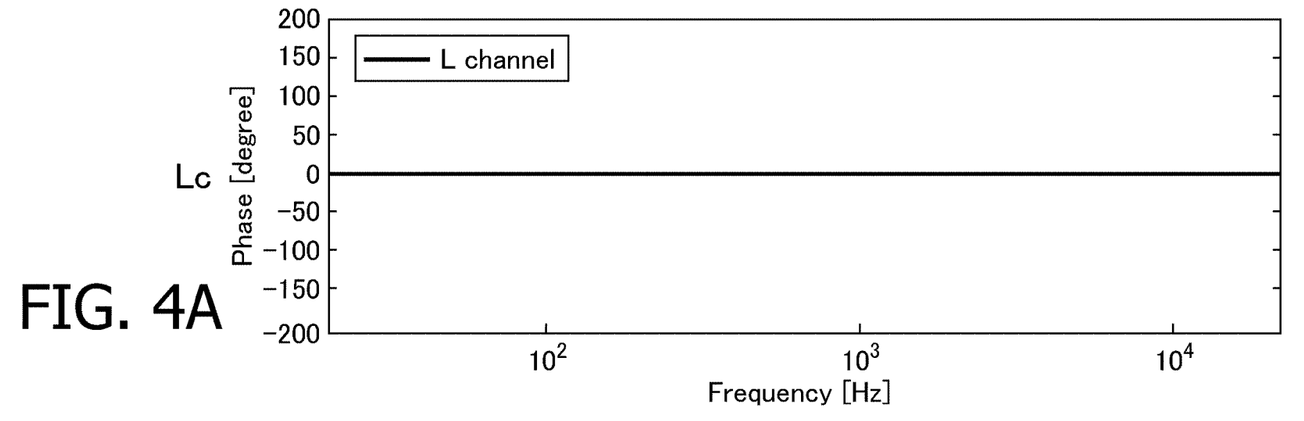
FIG. 4 is a diagram showing an example of phase control amount signals for each frequency band to be outputted from a phase control amount calculation unit provided to the sound processing device according to the embodiment of the present invention.
Figure 4B:
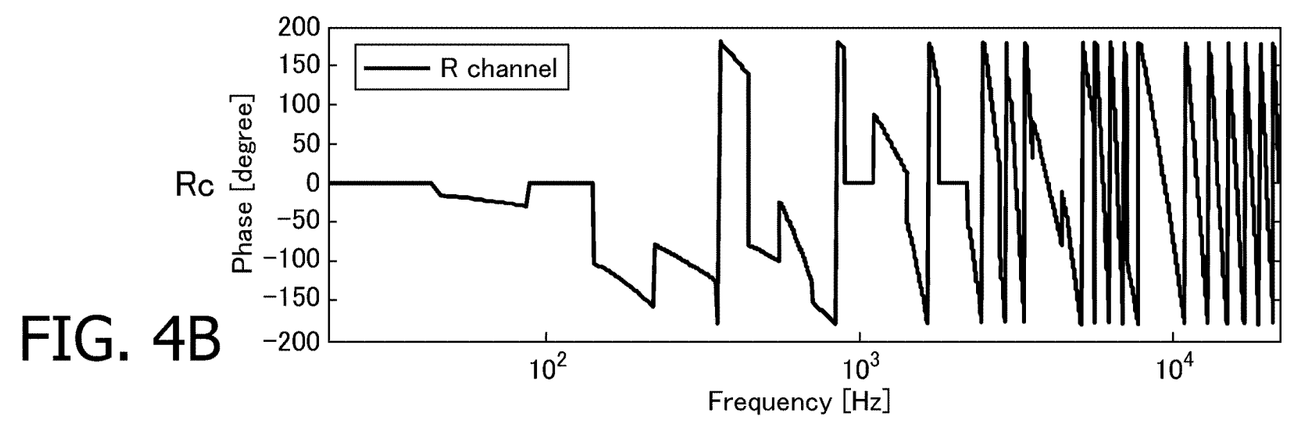

Examples of the phase control amount signals Lc and Rc for each frequency band outputted from the phase control amount calculation unit 14 are shown in FIG. 4A and FIG. 4B, respectively. In each of FIG. 4A and FIG. 4B, the vertical axis is the phase (unit: degree) and the lateral axis is the frequency (unit: Hz). As described above, the propagation delay time for the L channel side is 0 msec for all the frequency bands. Therefore, as shown in FIG. 4A, the signal Lc is a flat signal that does not include phase rotations and phase offsets. On the other hand, as shown in FIG. 4B, the signal Rc is a signal that includes phase rotations and phase offsets according to the propagation delay time (see FIG. 3B).

Figure 5A:
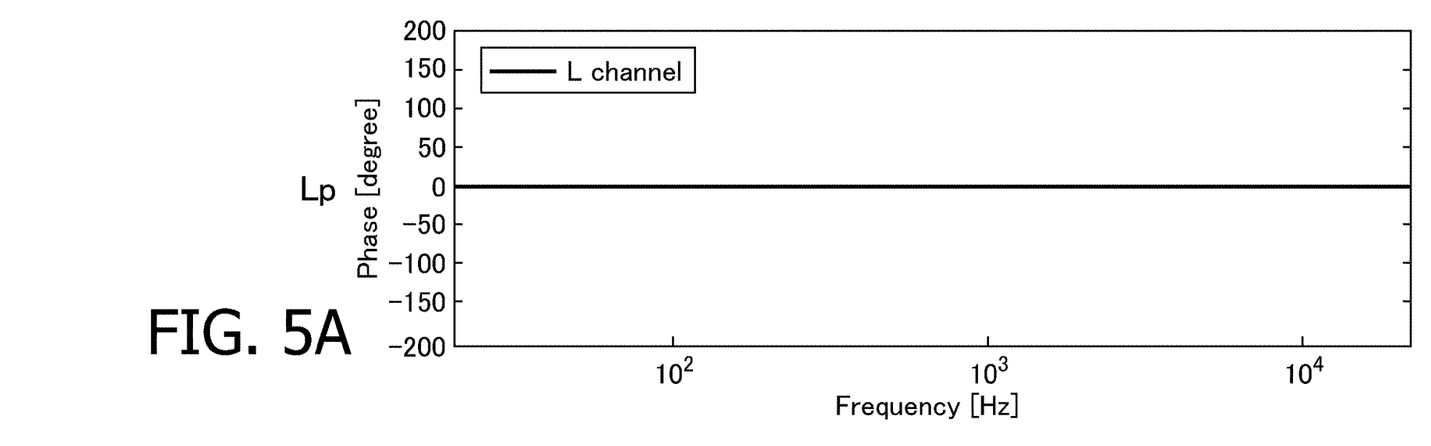
FIG. 5 is a diagram showing an example of phase control signals for each frequency band to be outputted from a phase smoothing unit provided to the sound processing device according to the embodiment of the present invention.
Figure 5B:
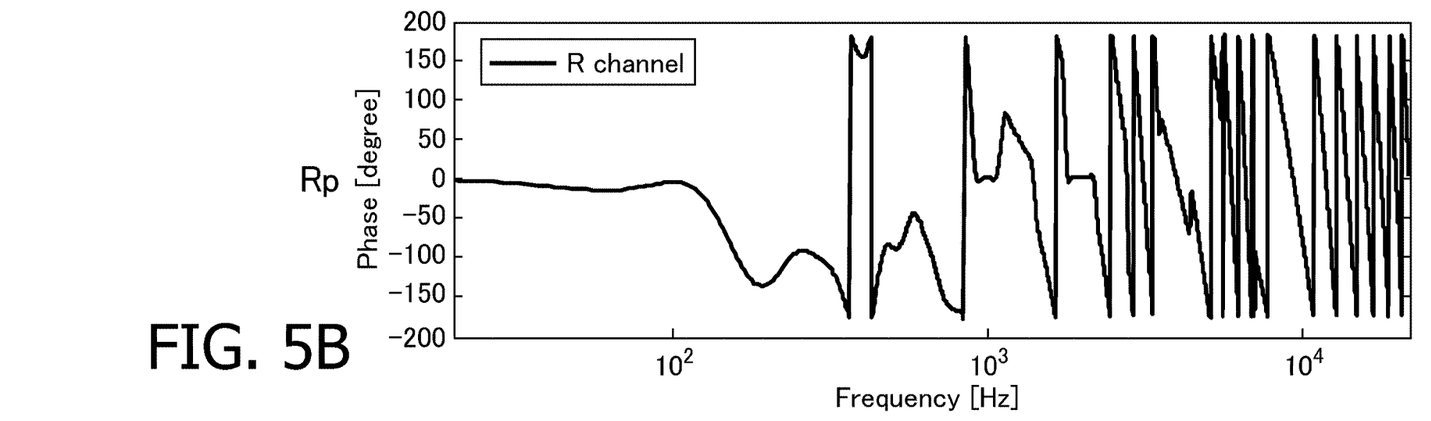

Examples of the phase control signals Lp and Rp for each frequency band outputted from the phase smoothing unit 15 are shown in FIG. 5A and FIG. 5B, respectively. In each of FIG. 5A and FIG. 5B, the vertical axis is the phase (unit: degree) and the lateral axis is the frequency (unit: Hz). In the integration process for the phase smoothing with the present exemplary specific values, an FIR low pass filter of which the order is 128 is used. A normalized cut off frequency of the FIR low pass filter is 0.05. It is noted that the FIR low pass filter is used only for the integration process for the phase smoothing. Therefore, the increase in the processing load due to the FIR low pass filter is minor. Also, the FIR low pass filter may be replaced with an IIR (Infinite Impulse Response) low pass filter.

Figure 6:
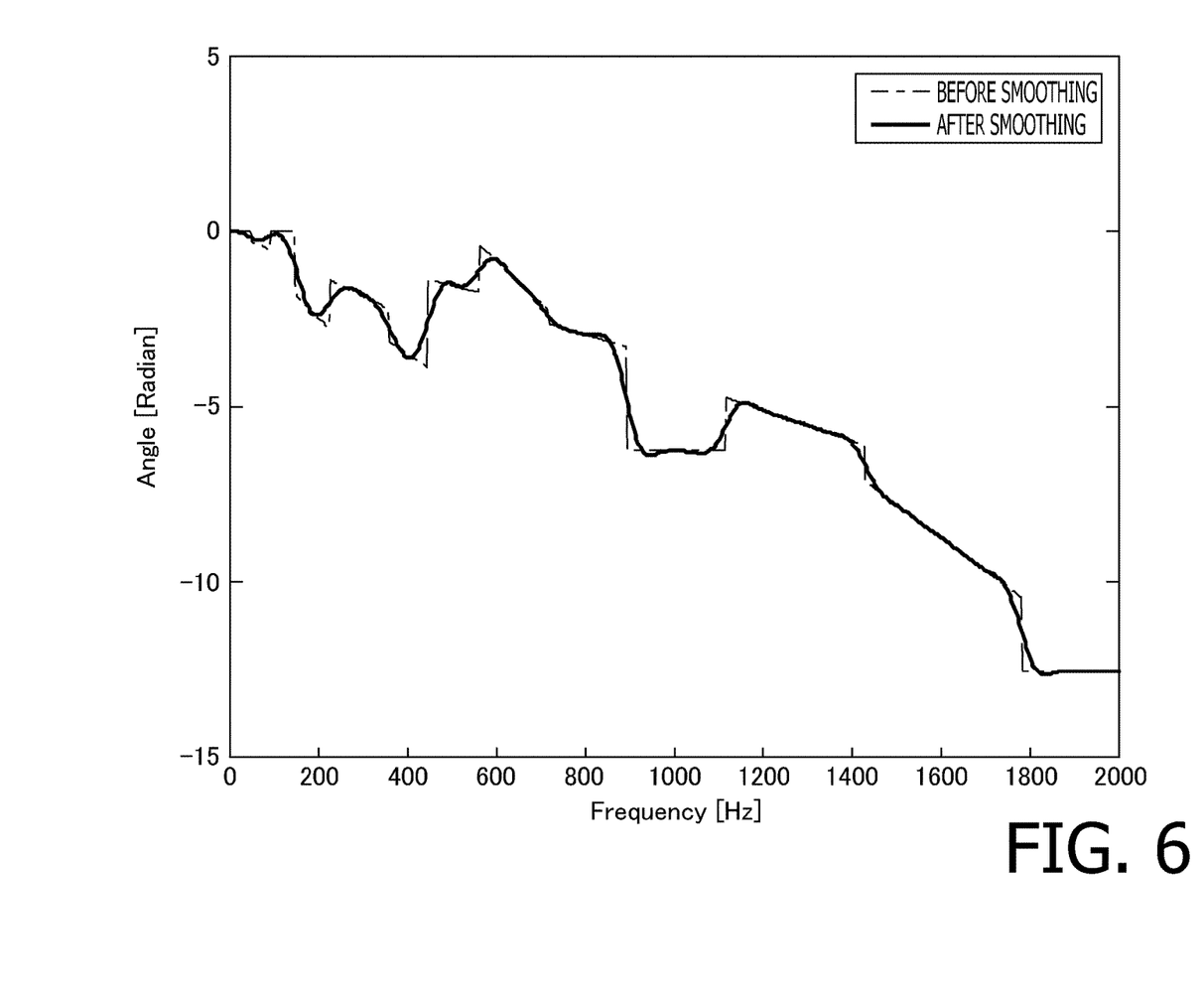
FIG. 6 is a diagram showing phase control amounts of R channel according to a setting by the propagation delay time setting unit according to the embodiment of the present invention, shown in continuous phase.

FIG. 6 is a diagram showing a phase control amount of R channel according to a setting by the propagation delay time setting unit 13, shown in continuous phase. In FIG. 6, the vertical axis is the angle (unit: radian) and the lateral axis is the frequency (unit: Hz). Also, In FIG. 6, the dashed line represents the phase control amount before the phase smoothing by the phase smoothing unit 15 (the phase control amount signal Rc shown in FIG. 4B), and the solid line represents the phase control amount after the phase smoothing by the phase smoothing unit 15 (the phase control signal Rp shown in FIG. 5B).

It is clear from the comparison of FIG. 4B and FIG. 5B or of the dashed line and the solid line in FIG. 6 that steep phase changes between frequency bands are smoothed through the phase smoothing by the phase smoothing unit 15. The frequency characteristic disorders due to phase interferences between frequency bands of which the propagation delay times differ from each other (the occurrence of peaks and/or dips) are thus suppressed.

Figure 7A:
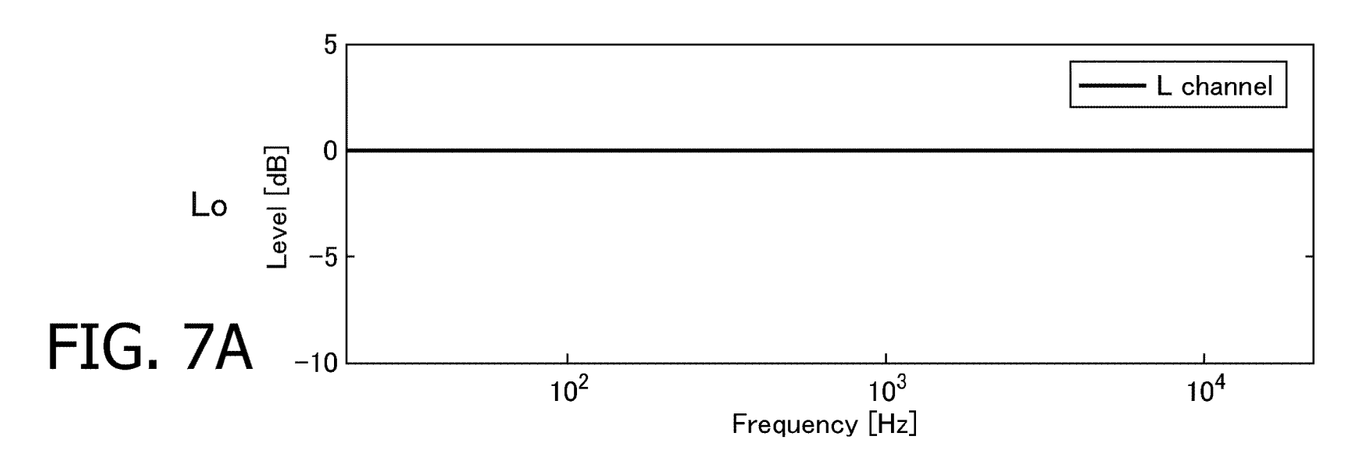
FIG. 7 is a diagram showing frequency characteristics of outputs (without phase smoothing) when impulse signals having flat frequency characteristics are inputted in the embodiment of the present invention.
Figure 7B:
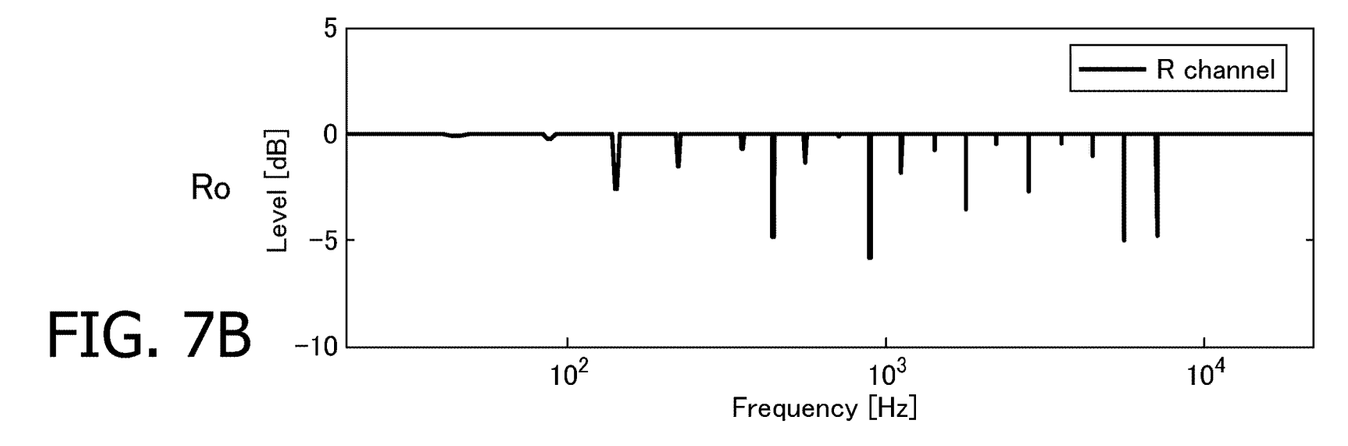
Figure 8A:
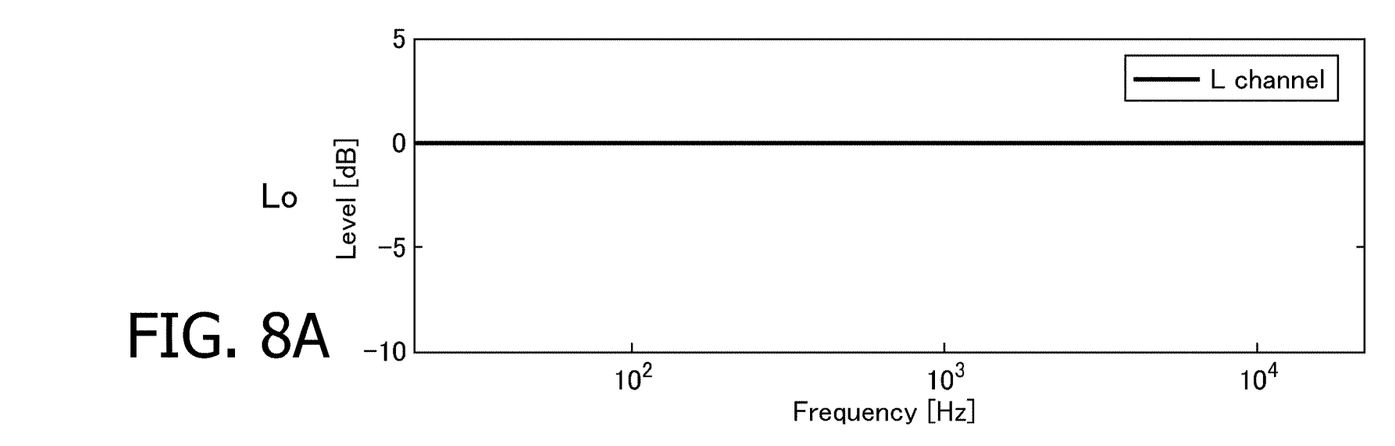
FIG. 8 is a diagram showing frequency characteristics of outputs (with phase smoothing) when impulse signals having flat frequency characteristics are inputted in the embodiment of the present invention.
Figure 8B:
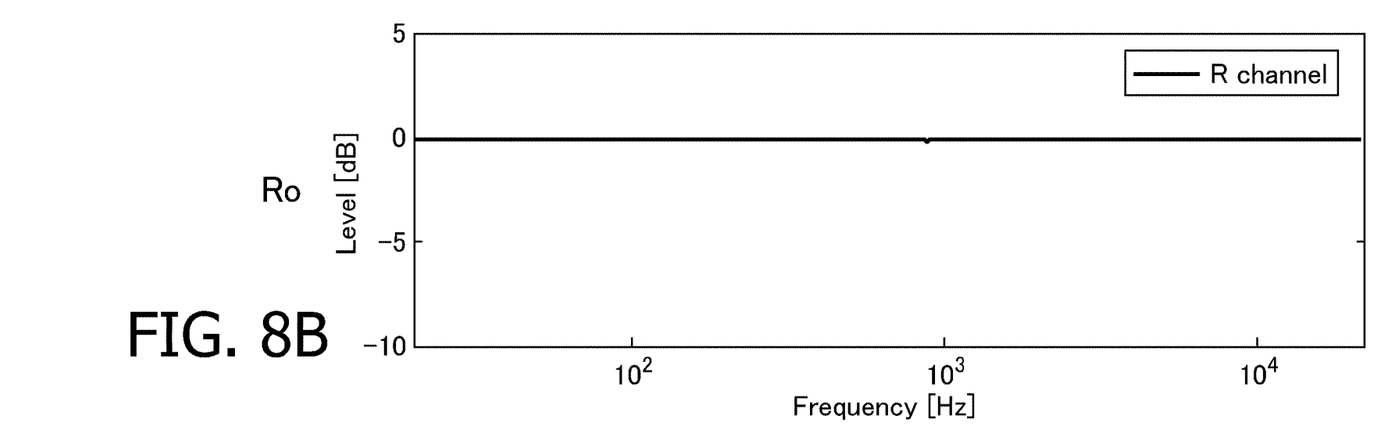

FIG. 7 and FIG. 8 are diagrams showing frequency characteristics of outputs (audio signals Lo and Ro) when impulse signals having flat frequency characteristics (audio signals L and R) are inputted in a state where the propagation delay times shown in FIG. 3 are set. In FIG. 7 and FIG. 8, the vertical axis is the level (unit: dB) and the lateral axis is the frequency (unit: Hz). FIG. 7A and FIG. 7B show frequency characteristics of audio signals Lo and Ro, respectively, in a case where the phase smoothing by the phase smoothing unit 15 is not performed. FIG. 8A and FIG. 8B show frequency characteristics of audio signals Lo and Ro, respectively, in a case where the phase smoothing by the phase smoothing unit 15 is performed. It is clear from the comparison of FIG. 7 and FIG. 8B that the frequency characteristics are flattened through the phase smoothing by the phase smoothing unit 15 and the frequency characteristic disorders due to phase interferences between frequency bands of which the propagation delay times differ from each other (the occurrence of peaks and/or dips) are suppressed.

Figure 9A:
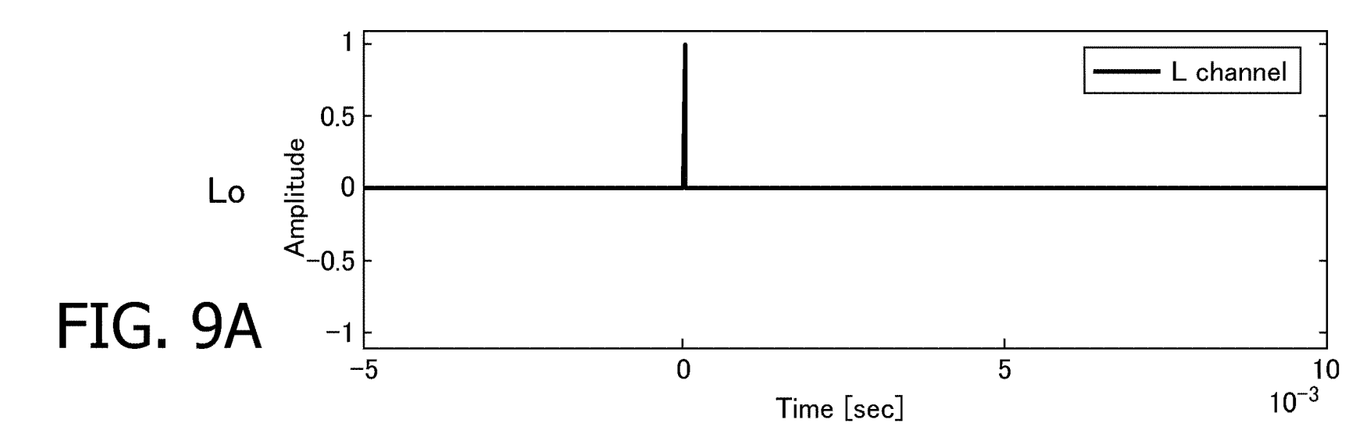
FIG. 9 is a diagram showing impulse responses corresponding to the frequency characteristics shown in FIG. 8.
Figure 9B:
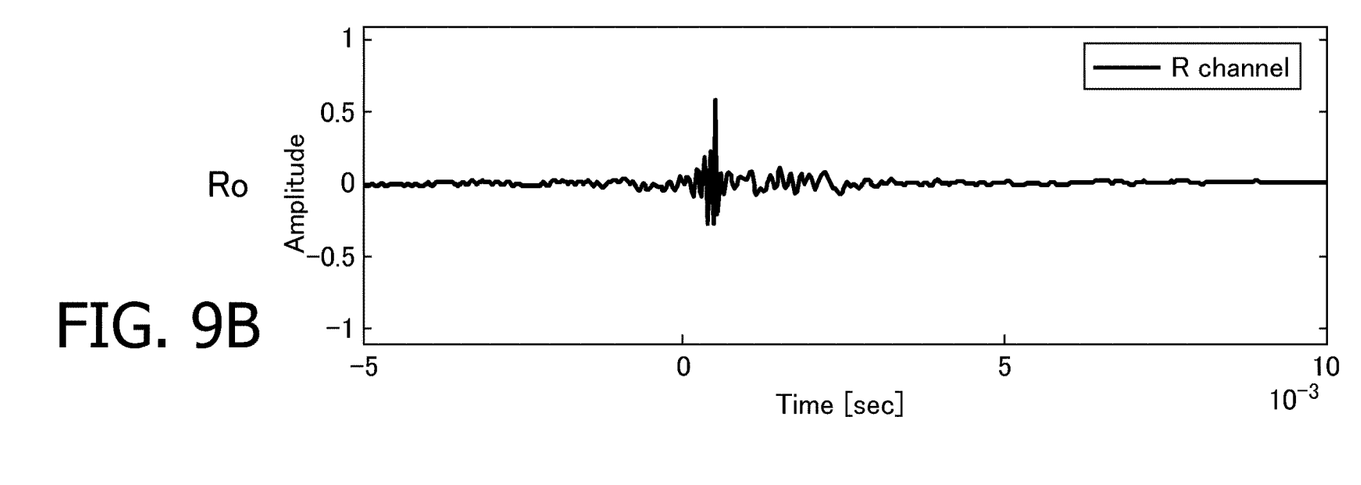

FIG. 9A and FIG. 9B show impulse responses corresponding to the frequency characteristics shown in FIG. 8A and FIG. 8B, respectively. In each of FIG. 9A and FIG. 9B, the vertical axis is the amplitude (normalized value) and the lateral axis is the time (unit: sec). It is clear from the comparison of FIG. 9A and FIG. 9B that an R channel impulse response (an audio signal Ro) is delayed with respect to an L channel impulse response (an audio signal Lo). More specifically, since the propagation delay time in the range of 0 msec-2.2 msec is given to each frequency band of the R channel impulse response (audio signal Ro), it is clear that various delays are included.

Figure 10A:
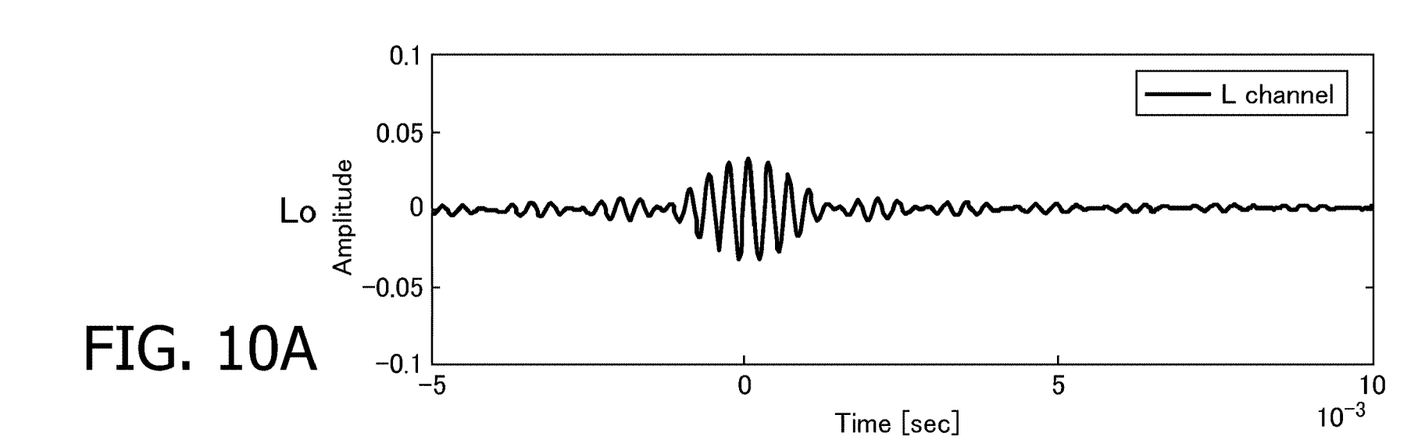
FIG. 10 is a diagram showing impulse responses (with phase smoothing) when impulse signals having flat frequency characteristics of which the frequency bands are limited to 2.8 kHz-3.5 kHz are inputted in the embodiment of the present invention.
Figure 10B:
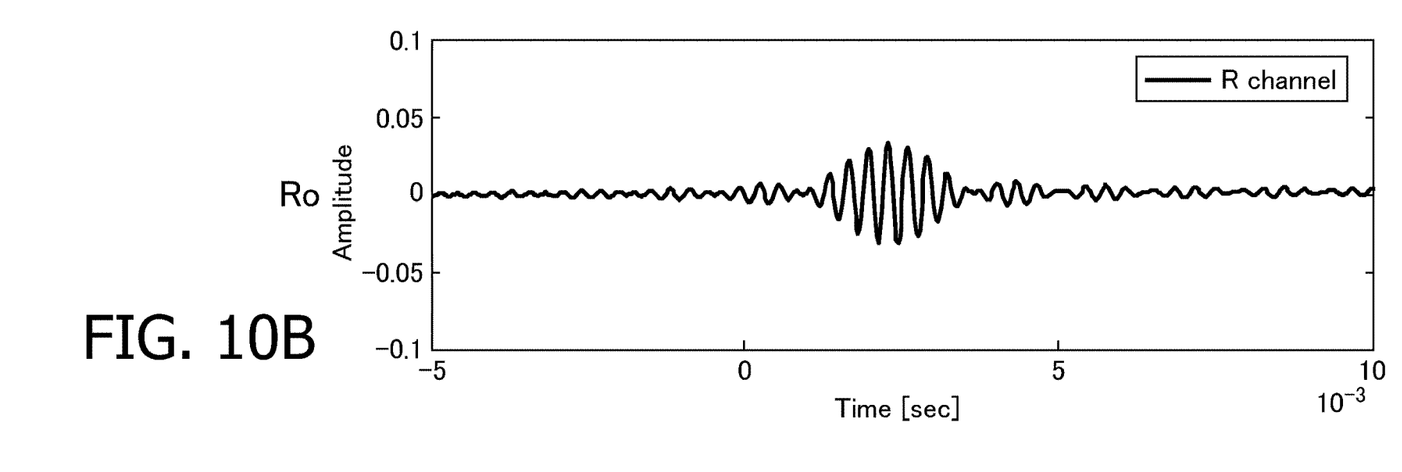

FIG. 10A and FIG. 10B show impulse responses (audio signals Lo and Ro), respectively, when impulse signals (audio signals L and R) of which the frequency bands are limited to 2.8 kHz-3.5 kHz and have flat frequency characteristics are inputted in a case where the propagation delay times shown in FIG. 3 are set. In each of FIG. 10A and FIG. 10B, the vertical axis is the amplitude (normalized value) and the lateral axis is the time (unit: sec). As shown in FIG. 3B, the propagation delay time set by the propagation delay time setting unit 13 in the frequency band of 2.8 kHz-3.5 kHz is 2.2 msec. It is clear from the comparison of FIG. 10A and FIG. 10B that only the propagation delay time (2.2 msec) is controlled while maintaining the phase within the frequency band.

The above is the description of the illustrative embodiment of the present invention. Embodiments of the present invention are not limited to the above explained embodiment, and various modifications are possible within the range of the technical concept of the present invention. For example, appropriate combinations of the exemplary embodiment specified in the specification and/or exemplary embodiments that are obvious from the specification are also included in the embodiments of the present invention.

What is claimed is:

1. A propagation delay time correction method for adjusting a propagation delay time of an audio signal of each of a plurality of channels to suppress sound image localization bias by Haas effect, comprising:
   generating a frequency spectrum signal by performing short-term Fourier transform on the audio signal;
   determining whether propagation delay times for respective frequency bands of a plurality of predetermined frequency bands are changed by a user, if the propagation delay times are changed,
   calculating phase control amounts for respective frequency bands of the plurality of predetermined frequency bands based on the propagation delay times respectively set for the plurality of predetermined frequency bands, the calculated phase control amounts representing a first phase control signal, and generating a second phase control signal by smoothing the first phase control signal in a frequency domain;
   controlling a phase of the frequency spectrum signal for each of the plurality of predetermined frequency bands on a basis of the second phase control signal; and
   generating an audio signal on which a propagation delay correction is applied by performing an inverse short-term Fourier transform on the frequency spectrum signal of which the phase is controlled for each of the plurality of predetermined frequency bands.

2. The propagation delay time correction method according to claim 1,
   wherein, in the controlling the phase of the frequency spectrum signal, the phase of the frequency spectrum signal for each of the plurality of predetermined frequency bands is rotated and offset on the basis of the second phase control signal.

3. The propagation delay time correction method according to claim 1, further comprising specifying at least one of a number and a width of frequency bands to which the propagation delay time is to be set.

4. A propagation delay time correction method for adjusting a propagation delay time of an audio signal of one of right and left channels to suppress sound image localization bias by Haas effect, comprising:
   generating a frequency spectrum signal by performing short-term Fourier transform on the audio signal;
   determining whether propagation delay times for respective frequency bands of a plurality of predetermined frequency bands are changed by a user, if the propagation delay times are changed,
   calculating phase control amounts for respective frequency bands of the plurality of predetermined frequency bands based on the propagation delay times respectively set for the plurality of predetermined frequency bands, the calculated phase control amounts representing a first phase control signal, and generating a second phase control signal by smoothing the first phase control signal in a frequency domain;
   controlling a phase of the frequency spectrum signal for each of the plurality of predetermined frequency bands on a basis of the second phase control signal; and
   generating an audio signal on which a propagation delay correction is applied by performing an inverse short-term Fourier transform on the frequency spectrum signal of which the phase is controlled for each of the plurality of predetermined frequency bands.

5. The propagation delay time correction method according to claim 4,
wherein, in the controlling the phase of the frequency spectrum signal, the phase of the frequency spectrum signal for each of the plurality of predetermined frequency bands is rotated and offset on the basis of the second phase control signal.

6. The propagation delay time correction method according to claim 4, further comprising specifying at least one of a number and a width of frequency bands to which the propagation delay time is to be set.

* * * * *